United States Patent
Griffault

(10) Patent No.: US 7,741,830 B2
(45) Date of Patent: Jun. 22, 2010

(54) IMAGE CANCELLATION IN FREQUENCY CONVERTERS FOR SPECTRUM ANALYSERS

(75) Inventor: Jacky Griffault, Gif sur Yvette (FR)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/718,497

(22) PCT Filed: Nov. 10, 2005

(86) PCT No.: PCT/IB2005/053702

§ 371 (c)(1),
(2), (4) Date: Jul. 17, 2007

(87) PCT Pub. No.: WO2006/051498

PCT Pub. Date: May 18, 2006

(65) Prior Publication Data

US 2008/0136401 A1    Jun. 12, 2008

(30) Foreign Application Priority Data

Nov. 10, 2004    (EP)    ................... 04292676

(51) Int. Cl.
*G01R 19/00* (2006.01)
*G01R 23/14* (2006.01)

(52) U.S. Cl. ............... 324/76.19; 324/76.11; 324/76.23

(58) Field of Classification Search ............... 324/76.19, 324/76.23, 190

See application file for complete search history.

(56) References Cited

U.S. PATENT DOCUMENTS

| 4,451,782 A | * | 5/1984 | Ashida .................... 324/76.26 |
| 4,950,999 A | * | 8/1990 | Agnello et al. ........... 324/76.22 |
| 6,265,861 B1 | * | 7/2001 | Musha .................... 324/76.23 |
| 6,861,833 B2 | * | 3/2005 | Miyauchi ................. 324/76.19 |
| 7,116,092 B2 | * | 10/2006 | Jenkins et al. ........... 324/76.19 |
| 2004/0041554 A1 | | 3/2004 | Miyauchi |

OTHER PUBLICATIONS

U.S. Appl. No. 11/718,486 to Griffault, filed May 2, 2007.

* cited by examiner

*Primary Examiner*—Timothy J Dole
*Assistant Examiner*—Farhana Hoque
(74) *Attorney, Agent, or Firm*—Greenblum & Bernstein, P.L.C.

(57) ABSTRACT

The process eliminates image rays generated in a frequency converting device generating actual rays and image rays from frequency rays of an input signal. The frequency converting device comprising a mixer mixing the input signal and a signal provided by a local oscillator and a filter assembly filtering the mixed signals output by the mixer. In a first sweep and a second sweep, the frequency of the oscillator is varied and the signal level at the output of the frequency converting device is recorded for a set of converted frequencies. The second sweep is carried out so that the frequency of the actual ray generated in the second sweep by an input ray is the same as the frequency of the actual ray generated in said first sweep by said input ray, and the frequency of the image ray generated in the second sweep by an input ray is not the same as the frequency of the image ray generated in said first sweep by said input ray. Then, the process determines if a ray-including signal level was recorded both during the first sweep and the second sweep for at least one converted frequency and displays an indication of the presence of a ray for said at least one converted frequency on a screen only if said determination is positive.

10 Claims, 3 Drawing Sheets

IMAGE CANCELLATION IN FREQUENCY CONVERTERS FOR SPECTRUM ANALYSERS

TECHNICAL FIELD

The present invention relates to frequency converters. More specifically, it relates to a process for avoiding images rays in a frequency converter.

BACKGROUND ART

A spectrum analyser is a measuring instrument, which quantifies the energy, or the electromagnetic power contained in each frequency of the electromagnetic spectrum of a signal to be analysed. Such analysers typically operate in a frequency range from a few hundreds hertz or less to a few gigahertz. This instrument is used to design radio frequency and microwave systems and is particularly useful for measuring the electromagnetic perturbations, which disturb wireless transmissions. It is also used for verifying and tuning communication systems installed on high point like specialised towers, high buildings and the like. For these reasons and because wireless transmission is a fast growing business, weight and volume become more and more important for security and working conditions of users.

To determine the spectrum e.g. the power at each frequency, between a minimum frequency $f_{min}$ and a maximum frequency $f_{max}$, it is necessary to scan the operating spectrum with a band-pass filter and to measure the power at the output of the filter. The bandwidth of the filter has to be variable to be able to separate close signals or to scan the entire bandwidth rapidly. As no technology is available to make this filtering directly in the entire frequency range, the signal to be analysed is usually converted to a given frequency, by heterodyning, and is filtered accordingly. The minimum value and the maximum value of the filter's bandwidth depends on the general performance of the instrument. For a medium class instrument, the filter is variable from 300 Hz to 3 MHz with step ratio 1, 3, 10, etc.

The frequency converter is basically a mixer. A mixer is a component well known in the art and which is a multiplier of signals, these signals can be decomposed in sum of sinusoidal signals as Fourier demonstrates. A mixing process is then a multiplication of sinusoidal signals. For the simplicity of the discussion, the mixer is considered perfect, i.e. only the first order of the multiplication is considered. We will use the simple well known equation $$\sin(A)\cdot\sin(B)=0.5\cdot[\cos(A-B)-\cos(A+B)]$$

In which sinA is a sinusoidal signal at the input of the mixer and B a sinusoidal signal supplied by a local oscillator, hereafter abbreviated LO.

FIG. 1 shows partly of a prior art device, used in the front end of commercially available spectrum analyser like the ones sold by the applicant. The problems to be solved according to the invention is discussed in reference to this figure, using a simple numerical example. The device of FIG. 1 comprises a mixer 2, that mixes the signal to be analysed and the output of a local oscillator 4 at a frequency fol. The output of the mixer is applied to a band-pass filter 6, filtering around a frequency fi. A second mixer 16 and a second local oscillator 15 convert this frequency fi—called intermediate frequency IF—to the final frequency for which the technology exists for an easy and efficient analysis. A filter 17 eliminates the undesired frequency at the output of the second mixer. A direct conversion needs a very high selectivity of filter 6 which in most cases is not suitable for the type of instruments described here.

The operation of the device of FIG. 1 is the following. Local oscillator 4 and mixer 2 convert signals received by the converting device into a signal at the intermediate frequency fi. At this frequency, bandpass filter 6 eliminates the undesired frequencies called spurious frequencies created by the mixing in the mixer. The mixer creates a signal at the frequency fi when the input signal frequency is lower and higher than the frequency of the first local oscillator, specifically:

$$|fol-\text{fin}|=fi \qquad (1)$$

where fin is a frequency ray in the signal input to the mixer.

For determining whether there exists a ray at a given frequency fin in the signal applied to the device of FIG. 1, the frequency of the local oscillator is controlled, so that $$fol-\text{fin}=fi \qquad (2)$$

Thus, when the local oscillator is set at a frequency fol=fi+fin, a signal at the output of filter 6 is representative of a ray at fin in the signal applied to the mixer.

A frequency fin', called image frequency, may also create a ray at a frequency fi at the output of mixer 2 and filter 6, when the frequency of the oscillator is selected according to (2). Indeed, assuming that $$fol=\text{fin}+fi \qquad (2')$$

then a ray at a frequency $$\text{fin}'=fol+fi=\text{fin}+2\cdot fi \qquad (3)$$

in the signal applied to the mixer, will also generate a ray at fi at the output of the mixer. Indeed, the mixer provides signals at $$\text{fin}'-fol=fi$$

Thus, for a given value of the frequency of the oscillator, a ray at the output of the mixer may be representative of the searched frequency fin, but may also indicate that there exists an image frequency. The image frequency is offset of 2.fi with respect to the searched frequency.

If the oscillator frequency is swept for providing a spectrum of the input signals, then, for a ray at a given frequency $f_{in}$ in the input signal, a ray appears at $$fol=\text{fin}+fi$$

and $$fol'=\text{fin}-fi$$

This provides two rays at the output of the mixer per signal at the input.

For instance, assuming the intermediate frequency is 400 MHz. Assuming there is an actual ray at fin=10 GHz in the input signal. For searching rays around 10 GHz in the input signal, the oscillator is set at a frequency fol=10.4 GHz. A ray then appears at the output of the mixer: this is the expected ray. However, a ray in the spectrum at fin'=10.8 GHz would also cause a signal to appear at a frequency of 400 MHz at the output of the mixer, when the oscillator is set at fol=10.4 GHz.

In a sweeping mode, assume there exists a ray at fin=10 GHz in the input signal. A signal at the output of the mixer appears when fol is 10.4 GHz. However, a signal at the output of the mixer also appears when the oscillator is set at a frequency fol=9.6 GHz.

In both case, there is a problem of image ray.

One solution to this known problem is to filter the signal applied to the converter, using a settable filter 1 known as a pre-filter. In the example given above, when the frequency of the oscillator is set at 10.4 GHz, the input signal could be filtered around 10 GHz, for avoiding the image frequency at 10.8 GHz. This solution is rather costly and difficult to implement over a broad range of frequencies, e.g. from 3 to 50 GHz and from our knowledge no commercial product exists up to now for a wider range. This pre-filter 1 is also heavy, rather big and need a high power consumption which is a big penalty for a mobile system working on batteries. Note that when using a pre-filter 1, as seen above, the first IF frequency is generally around 400 MHz because of the limited quality factor of pre-filter 1 which has to filter the image rays. This explains the need of a second mixer and a second oscillator.

Another solution is currently used in the spectrum analysers sold by the applicant under reference R3273 for the very high frequencies above 30 GHz. Two successive sweep results are superimposed for analysing a given spectrum. In the first sweep, one assumes that $$fol-fin=fi \qquad (2)$$

and one displays on the screen, where x coordinates is frequency, the rays at frequencies $$fol-fi=fin \qquad (4)$$

Any time there is a signal at the output of the mixer when the oscillator is set at a frequency fol, a ray proportional to its power level is displayed on the screen. Assuming there is a ray at fin in the signal input to the mixer, there is a signal at the output of the mixer when $$fol-fin=fi \qquad (2)$$

and when $$fin-fol=fi \qquad (5)$$

In case of (2), one displays a ray on the screen at fin; in the case of (5), one displays on the screen a ray at fin−2·fi, which is an image ray not corresponding to an actual ray in the signal input to the mixer.

In the second sweep, one assumes that $$fin-fol=fi \qquad (5)$$

and one displays on the screen a ray at a frequency $$fol+fi=fin \qquad (6)$$

any time there is a signal at the output of the mixer when the oscillator is set at a frequency fol. Assuming there is a ray at fin in the signal input to the mixer, there is a signal at the output of the mixer when $$fol-fin=fi \qquad (2)$$

and when $$fin-fol=fi \qquad (5)$$

In case of (5), one displays a ray on the screen at fin; in the case of (2), one displays on the screen a ray at fin+2·fi, which is an image ray not corresponding to an actual ray in the signal input to the mixer.

For a given spectral ray at fin, when the two sweeps are successively displayed on the same screen, there appears on the screen three rays:
- one ray at a frequency fin, which is present in both sweeps;
- one ray at a frequency fin'=fin−2·fi, which appears in one of the sweeps;
- one ray at a frequency fin''=fin+2·$f_i$, which appears in one of the sweeps.

The first ray is stable on the screen; the other two rays flicker, since they only appear in one of the two sweeps. This makes it possible to distinguish the image rays, and locate the frequency rays actually existing in the input signal.

Assuming again the first intermediate frequency is 400 MHz. Assuming there exists a ray at fin=10 GHz in the input signal. In the first sweep, a ray appears at the output of the mixer when the oscillator is set at a frequency fol=10.4 GHz, which corresponds to the expected ray at 10 GHz. However, there is also a signal at the output of the mixer when fol=9.6 GHz, that is for the image ray in the spectrum at fin'=9.2 GHz. In the first sweep, rays at 9.2 and 10.0 GHz are displayed.

In the second sweep, a ray appears at the output of the mixer when the oscillator is set at a frequency fol=9.6 GHz, this corresponding to the expected ray at fin=10 GHz; another ray is present at the output of the mixer when fol=10.4 GHz, that is for the image ray in the spectrum at fin'=10.8 GHz. In the second sweep, rays at 10.0 and 10.8 GHz are displayed.

When the two sweeps are displayed at the refresh speed of the instrument, rays at 9.2 and 10.8 GHz are flickering, while the ray at 10.0 GHz is stable. This makes it possible for the user to distinguish the actual rays, and to realise that the other two rays are artefacts.

However, a problem is that the display of successive sweeps on a screen may make it quite difficult to distinguish between actual or stable rays and image or flickering rays. This is notably the case where the number of rays increases.

Thus, the invention provides a solution to this problem by eliminating the image rays from the display.

The invention is also based on the following new problem: under specific circumstances, the prior art operation under two sweeps may not prove satisfactory. For instance, assume two rays are present in the input signals. For certain spacing between the rays, there may appear stable rays which actually do not represent any actual ray in the input signal, but simply represent spurious responses that are identical for both actual rays.

Specifically, assume the input signal has two rays at $fin_1$ and $fin_2$, with $fin_1 < fin_2$. One sweep generates rays at $fin_1$, $fin_2$, $fin'_1 = fin_1 - 2 \cdot fi$ and $fin'_2 = fin_2 - 2 \cdot fi$; the second sweep generates rays at $fin_1$, $fin_2$, $fin''_1 = fin_1 + 2 \cdot fi$ and $fin''_2 = fin_2 + 2fi$. Assuming for instance:

$$fin'_2 = fin''_1 \qquad (7),$$

that is:

$$fin_1 + 2 \cdot fi = fin_2 - 2 \cdot fi$$

$$fin_2 = fin_1 + 4 \cdot fi$$

In this case, there appears on the screen three stable rays, and two flickering rays.

With the same example of 400 MHz, assume there are two rays at $fin_1$=10 GHz and $fin_2$=11.6 GHz in the input signal. In the first sweep, a ray appears at the output of the mixer when the oscillator is set at a frequency fol=10.4 GHz, this corresponding to $fin_1$. However, there is also a signal at the output of the mixer when fol=9.6 GHz, that is for the image ray in the spectrum at $fin'_1$=9.2 GHz. Similarly, for the second ray at $fin_2$, a ray appears at the output of the mixer when the oscillator is set at a frequency fol=12.0 GHz, this corresponding to $fin_2$; there is also a signal at the output of the mixer when fol=11.2 GHz, that is for the image ray in the spectrum at $fin'_2$=10.8 GHz.

In the second sweep, a ray appears at the output of the mixer when the oscillator is set at a frequency fol=9.6 GHz, this corresponding to $fin_1$. However, there is also a signal at the output of the mixer when fol=10.4 GHz, that is for the image ray in the spectrum at $fin''_1$=10.8 GHz. Similarly, for the second ray at $fin_2$, a ray appears at the output of the mixer when the oscillator is set at a frequency fol=11.2 GHz, this corresponding to $fin_2$; there is also a signal at the output of the mixer when fol=12.0 GHz, that is for the image ray in the spectrum at $fin''_2$=12.4 GHz.

Thus, stable rays at 10, 10.8 and 11.6 GHz appear on the screen; flickering rays at 9.2 and 12.4 GHz also appear on the screen. However, the ray at 10.8 GHz is also an image ray: it is an image ray of the second actual rays in the second sweep, and an image of the first actual ray in the first sweep.

This new problem is of course not limited to two actual rays, but is also present for more than two rays, wherever a pair of rays is spaced by a frequency corresponding to $4 \cdot fi$.

DISCLOSURE OF THE INVENTION

The invention provides a solution to this new problem. It suggests to proceed with a sweep carried out so as to avoid any further doubts on the actual rays in the input signal after having carried out at least a first sweep, whatever the number and position of rays in the input signal.

More specifically, the invention provides a process for eliminating image rays generated in a frequency converting device generating actual rays and image rays from frequency rays of an input signal such as defined in claim 1. The dependent claims define preferred embodiments.

BEST MODE FOR CARRYING OUT THE INVENTION

Figure 1:
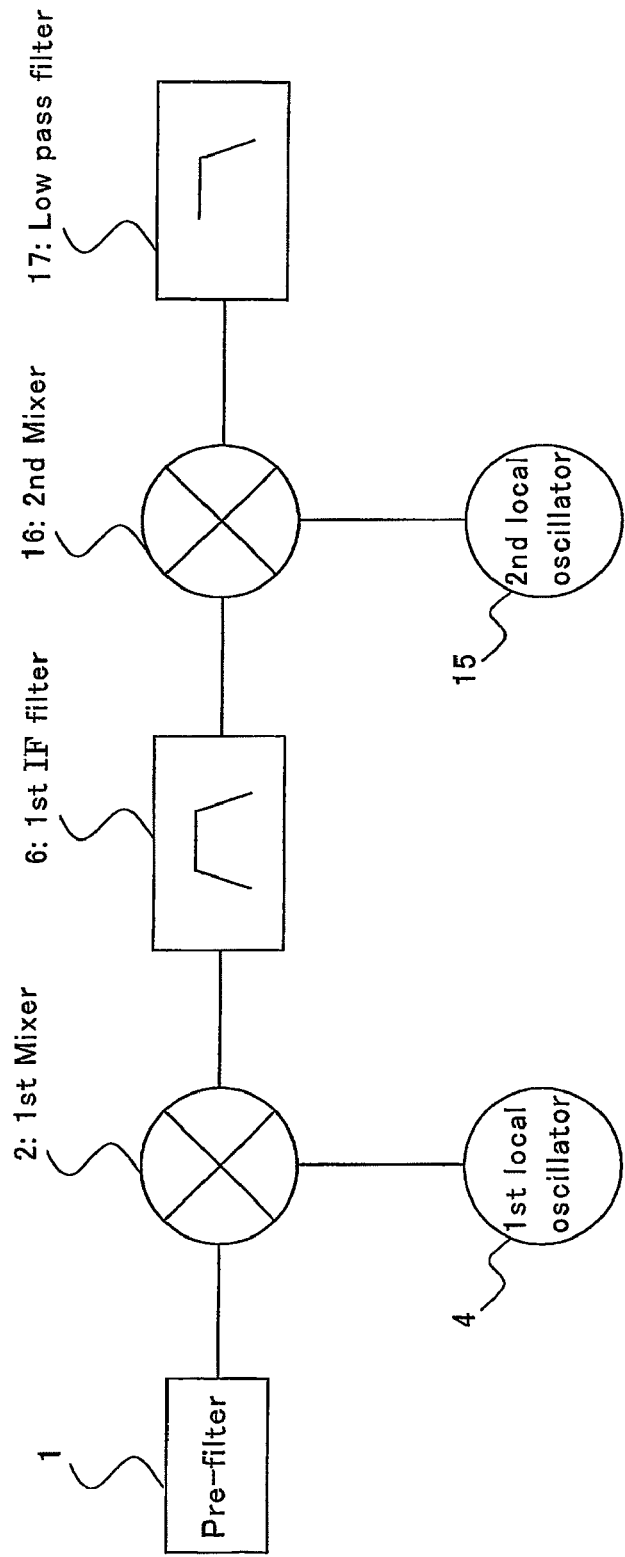
FIG. 1 is a schematic diagram of part of a prior art frequency converting device.

Further features and advantages of the invention will appear from the following description of embodiments of the invention, given as non-limiting example, with reference to the accompanying drawings.

The invention also suggests to eliminate the image rays from the display on the screen as will be described.

The invention also suggests proceeding with a third sweep, for distinguishing actual rays and image rays. The third sweep is carried out according to the rays identified in the first and second sweep, so as to eliminate any possible doubt as to actual and image rays.

More generally, the invention suggests proceeding with a at least a first sweep providing actual rays and image rays and then a further sweep for distinguishing actual rays and image rays which cannot be distinguished with said at least first sweep. The further sweep is carried out according to the rays identified in said at least first sweep, so as to eliminate any possible doubt as to actual and image rays.

The invention also suggests to use a first intermediate frequency filter composed by two filters chosen as described below.

The first and second sweeps may be carried out as in the prior art solution; again, this can avoid any actual change in the hardware necessary for carrying out the first and second sweeps. One may also proceed with two sweeps under different conditions, as discussed below.

Assuming therefore there are several rays in the input signals, at frequencies $fin_1$ to $fin_n$, with n an integer. Again the intermediate frequency fi is within the bandwidth of the filter at the output of the mixer.

The first sweep may be carried out as above, under the assumption that $$fol - fin_i = fi \quad (8)$$

It then produces expected rays at $fin_i$, i varying from 1 to n.

The first sweep also produces image rays at the following frequencies:

$$fin'_i = fin_i - 2 \cdot fi$$

In other words, one finds out for the first sweep two rays for each actual ray in the input signal. One of these rays is generated by actual frequency rays present in the input signal, while the other one is an image ray. There is no way to distinguish between the two rays at the output of the mixer.

The second sweep is carried out so that the actual rays of the second sweep are identical to the actual rays of the first sweep; in addition image rays of the second sweep are offset with respect to image rays of the first sweep, at least under most circumstances. This may be done simply by shifting the frequencies of the local oscillator and of the filter by a same offset $\epsilon$ ($\epsilon$ being of course not equal to zero). The frequency offset $\epsilon$ is normally smaller than the input frequency or local oscillator frequency, and as we will see later can be positive or negative. In this case, relation (8) above becomes:

$$fol + \epsilon - fin_i = fi + \epsilon \quad (9)$$

However, the image ray is at a frequency $fin''_i$ given by:

$$fin'_i = fin_i - 2(fi+\epsilon) = fin'_i - 2 \cdot \epsilon \quad (10)$$

The image frequency in the second sweep is offset by $2 \cdot (fi+\epsilon)$ with respect to the actual searched frequency. In addition, the image frequency in the second sweep is offset by $2 \cdot \epsilon$ with respect to the image frequency in the first sweep.

The second sweep thus produces expected rays at $fin_k$, k varying from 1 to n.

It also produces image rays at the following frequencies:

$$fin''_k = fin_k - 2 \cdot (fi+\epsilon) = fin'_k - 2 \cdot \epsilon$$

Note that this corresponds to the solution used in spectrum analysers R3273 in the case where $\epsilon$ equals to $-2 \cdot fi$. But according to the invention, the offset is not necessarily $+/-2 \cdot fi$, but can take any other value.

The prior art solution relies on the fact that the image rays $fin'_j$ and $fin''_k$ are at different frequencies to distinguish between image rays and actual rays. As discussed above, this solution may not be sufficient where there are rays in the input signals with a frequency spacing such that, for at least one couple (j, k) of integers, $$fin''_k = fin'_j$$

The invention thus suggests proceeding with a third sweep, for distinguishing between actual rays and image rays. In the third sweep, as in the second sweep, actual rays are identical to the actual rays of the first and second sweeps; image rays of the third sweep are offset with respect to image rays of the first and second sweeps; preferably, the third sweep is carried out so that image rays in the third sweep are distinct from image rays confused in the first and second sweeps.

For carrying out the third sweep, the local oscillator and the image frequency are shifted by a second offset $\epsilon_2$ which is different from the first offset $\epsilon$ (and $\epsilon_2$ being of course also not equal to zero). This makes it possible to distinguish between actual rays and image rays. Specifically, relation (9) above becomes:

$$fol+\epsilon_2-fin_i=fi+\epsilon_2 \quad (11)$$

However, the image ray is at a frequency $fin'''_i$ given by $$\begin{aligned} fin'''_i &= fin_i - 2(fi + \epsilon_2) \quad (12) \\ &= fin'_i - 2 \cdot \epsilon_2 \\ &= fin''_i - 2 \cdot (\epsilon_2 - \epsilon) \end{aligned}$$

The image frequency in the third sweep is offset by $2 \cdot (fi+\epsilon_2)$ with respect to the searched frequency. In addition, the image frequency $fin'''_i$ in the third sweep is offset by $2 \cdot \epsilon_2$ with respect to the image frequency $fin'_i$ in the first sweep, and is offset by $2 \cdot (\epsilon_2-\epsilon)$ with respect to the image frequency $fin''_i$ in the second sweep.

The third sweep thus produces expected rays at $fin_1$, 1 varying from 1 to n.

It also produces image rays at the following frequencies:

$$fin'''_1=fin_1-2\cdot(fi+\epsilon_2)=fin'_1-2\epsilon_2 \quad (13)$$

Preferably, the second offsets is selected so that the image rays produced in the third sweep are different from any ray produced in both the first and second sweeps. This may be carried out by determining, after the first and second sweep, which rays are identically provided in the first and second sweeps. Identical rays comprise actual rays; indeed, as indicated above, the actual rays are identical in the first and second sweeps. In addition, image rays may be superimposed in the first and second sweeps, in the case where, for a pair (j, k) of integers $$fin''_k=fin'_j$$

that is where $$fin_j-fin_k=2\cdot\epsilon$$

After the first and second sweeps are carried out, one may identify those rays which appear in both sweeps. In the rest of this description, these rays are noted $F_t$, with t an integer, $1 \leq t \leq m$, with m the number of rays appearing in both sweeps.

Assuming all rays appearing in both sweeps are actual rays (although some of them are in fact superimposed image rays), then there exists a finite number of pair of rays; this finite number is $m \cdot (m-1)/2$. The value of the second offset $\epsilon_2$ may be selected so that the pair of rays will in any case produce different image frequencies with respect to those produced in the first sweep; this is ensured when $$\varepsilon_2 \neq \frac{F_t - F_u}{2} \quad (14)$$

for all possible values of integers t and u, with $1 \leq t \leq m$ and $1 \leq u \leq m$.

Alternatively, the value of the second offset $\epsilon_2$ may be selected so that the pair of rays will in any case produce different image frequencies with respect to those produced in the second sweep; this is also ensured when $$\varepsilon - \varepsilon_2 \neq \frac{F_t - F_u}{2} \quad (15)$$

for all possible values of integers t and u, with $1 \leq t \leq m$ and $1 \leq u \leq m$. The difference $\epsilon-\epsilon_2$ corresponds to the offset of the intermediate frequency of the third sweep with respect to the intermediate frequency of the second sweep.

Thus, it is possible to select an offset $\epsilon_2$ for the third sweep so that the image rays generated in the third sweep will differ from all image rays generated in the first and second sweeps. This makes it possible to distinguish between image rays and actual rays:

actual rays are present in all three sweeps, while
image rays are present at a same frequency at most in the two first sweeps.

One should note that the condition given in (14) or alternatively in (15), need not be tested for all pairs of frequencies in all circumstances. Indeed, considering (14) and assuming for instance that $\epsilon_2$ is less than fi, one should only test pairs of frequencies around $\pm 2 \cdot fi$ of each ray $F_t$. This limits the number of pairs of rays to be tested, after the first and second sweeps are carried out.

The method of the invention will be effective, whatever the set of actual rays in the input signals. Indeed, as explained, one may adapt the selection of the second offset so as to eliminate any superimposed image ray in the third sweep.

Figure 2:
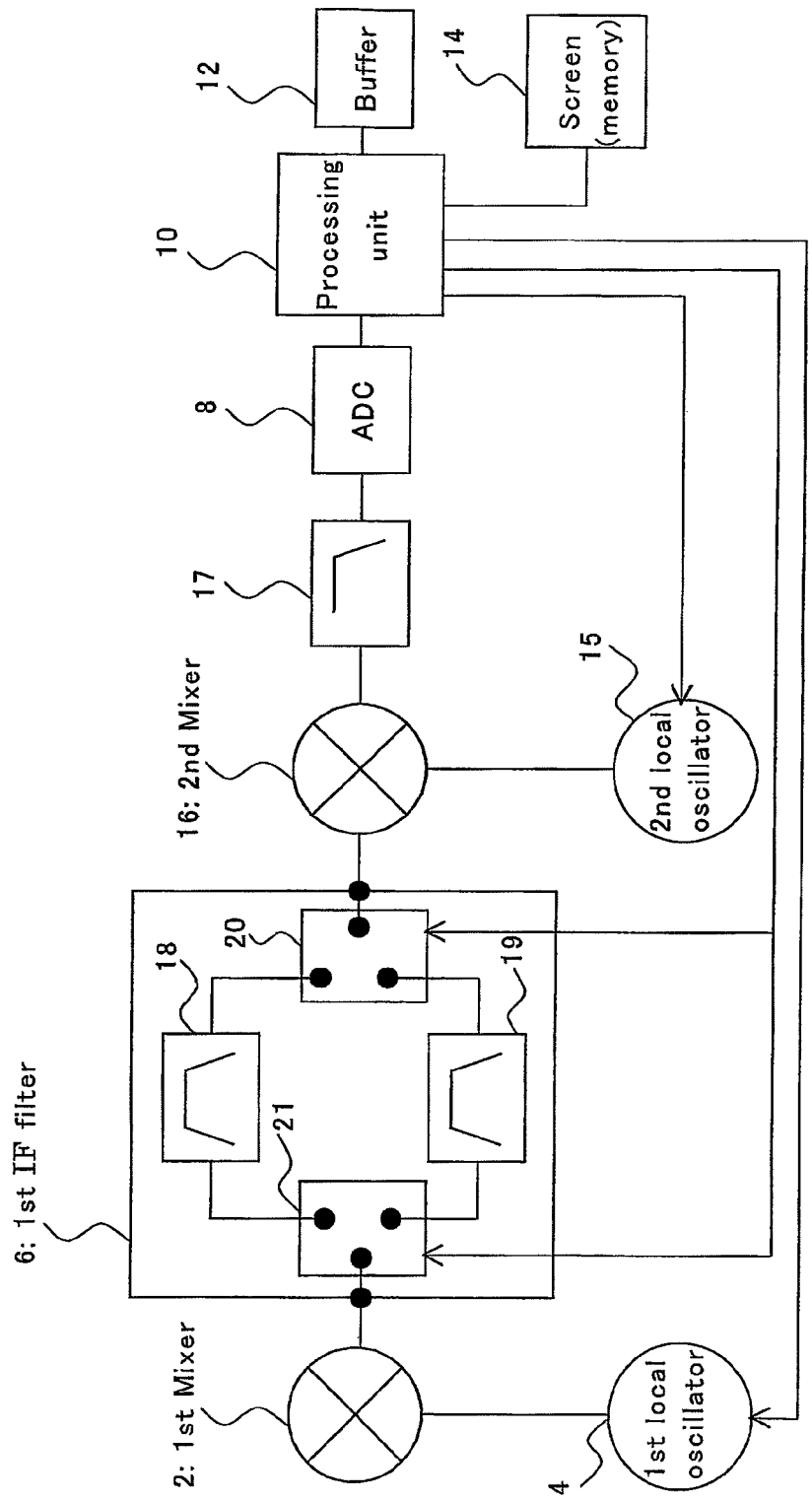
FIG. 2 is a diagram of a circuit for carrying out an embodiment of the invention.

FIG. 2 is a diagram of a circuit for carrying out the invention. Similarly to the circuit of FIG. 1, the circuit of FIG. 2 comprises a mixer 2 that mixes the signal to be analysed and the output of a first local oscillator 4 at a frequency fol. The output of the mixer is applied to a band-pass filter 6 filtering around a frequency fi and rejecting all other products of the mixing process.

State-of-the-art ADCs (analogue to digital converters) with a suitable resolution generally cannot work at high enough frequencies for a direct down conversion of the microwave signal. Thus, a second conversion is done by using a second local oscillator 15 and a second mixer 16 and a low pass filter 17.

For implementing the three-sweep process, one solution consists to use a wide enough filter 6 for example 10% of the fi, and to change the frequency of the second LO 15 accordingly to keep constant the final frequency. It is preferable to keep the final frequency constant for the state-of-the-art filtering circuits (analogue or digital). Similarly to the prior art such as for the above-mentioned spectrum analysers R3273, the first and second sweeps can be made by setting the frequency of LO 4 above the signal frequency and below the signal frequency at offset fi. In fact, this mean the particular case $\epsilon=+/-2 \cdot fi$. This also means that the necessary bandwidth of LO 4 has to be the bandwidth of the input signal to analyse increased by $2 \times fi$. Increasing the bandwidth by $2 \cdot fi$ is generally not desirable for a microwave system and especially for an oscillator at microwave frequencies.

The embodiment of the invention described in FIG. 2 avoids this penalty. It makes use of another intermediate frequency far enough from the first one to separate actual and image rays on the screen, but giving the possibility to keep the frequency of LO 4 always on the same "side" of the input signal (i.e. either above or under). This solution is simply a particular choice of $\epsilon$. Filter 6 is advantageously replaced by a set of two band-pass filters 18, 19 having each a fixed filtering frequency or bandwidth. Filter 18 is used for a first sweep, filter 19 for a second sweep. For this, filters 18, 19 are used or isolated from the circuit by using two common high isolation switches 20 and 21. These filters and switches can be made using low cost technology used in RF systems. In particular, filters 18, 19 can use the SAW technology and the switches can be GaAs switches.

The third sweep is done by choosing $\epsilon_2$ for a third intermediate frequency value in the bandwidth of filter 18 or in the bandwidth of filter 19. The frequency of second LO 15 is changed accordingly for each sweep to keep the final frequency constant.

To reduce the cost and the complexity of the second LO 15, it is advantageous to choose filter 18 and filter 19 so as to be image of each other in the mixer 16. This means that for a two sweeps process, filter 18 and filter 19 are used alternatively, but the frequency of second LO 15 is fixed. For the three-sweep process, the second LO 15 will vary but only by a few percents and with a low resolution, providing numerous solutions for choosing $\epsilon_2$ and remaining low cost.

The invention applies to a multi-carrier signal as shown above, and also to the harmonics generated by the mixing process in the mixer. These harmonics will appear like multi-image signals because the applied offset is simply multiplied by the harmonic orders for these images. Determining the best choice for $\epsilon_2$ is only a little bit more complicate within the skills of a person skilled in the art.

At the output of second mixer 16, the signals are treated for being displayed on a screen. Specifically, signals provided by filter 17 are first converted to digital signals in an A/D converter 8. After being converted, the signals are provided to a processing unit 10. The processing unit controls the frequency of the variable oscillator 4, as well as selecting the filter 18 or the filter 19 and controlling the frequency of the second oscillator 15. In addition, the processing unit may read from and write into a buffer 12. The processing unit may also display signals to a screen 14 having a display memory.

Figure 3:
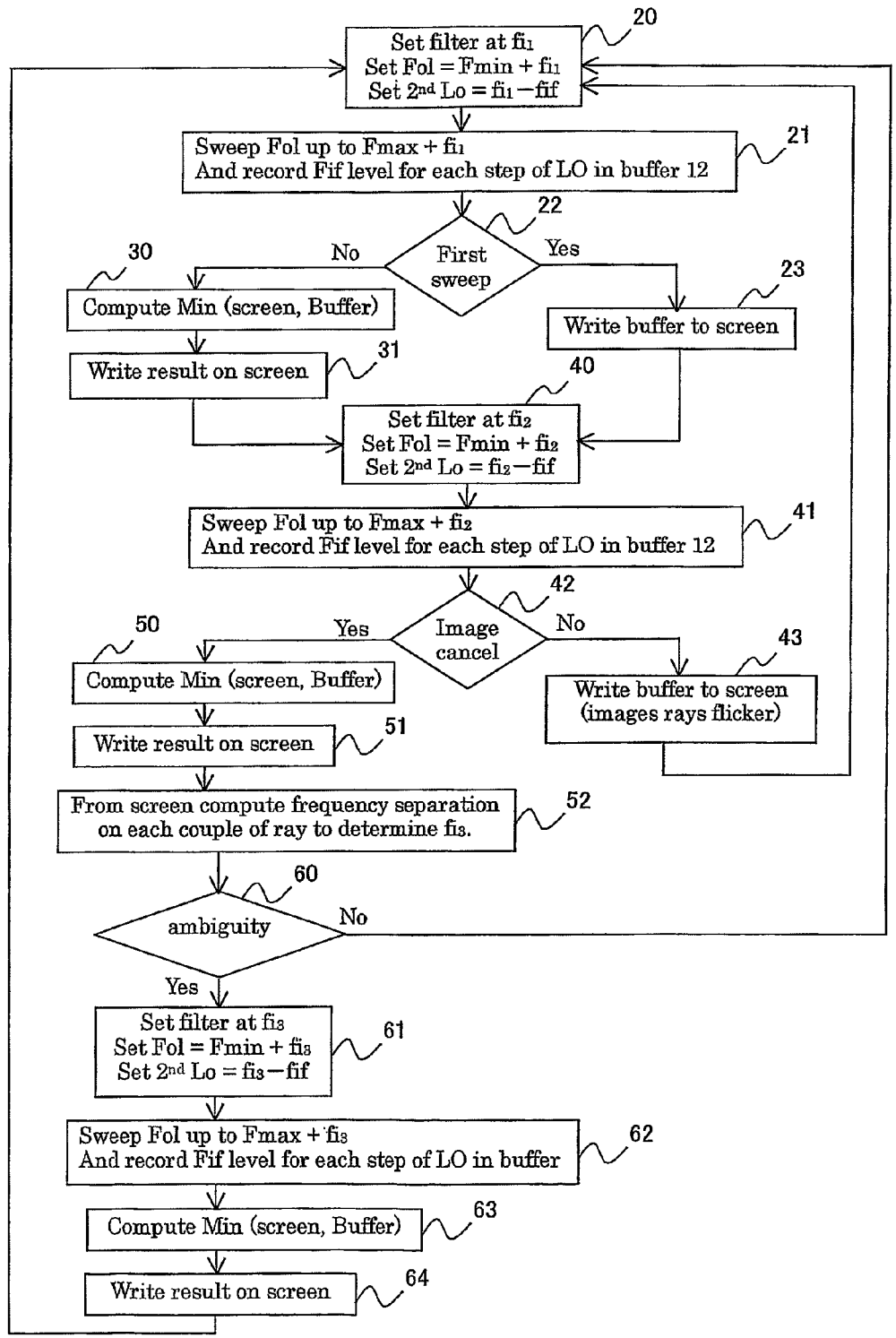
FIG. 3 is a flowchart of a process according to the invention.

The operation of the device of FIG. 2 will be explained in reference to FIG. 3. For the sake of simplicity and clarity, it is assumed that the frequency of local oscillator 4 varies stepwise, its frequency increasing during one sweep; in the example, the input spectrum is analysed between frequencies $f_{min}$ and $f_{max}$. It is also assumed for simplicity that the resolution of the step is compatible with the bandwidth of the analysis filter—not shown—classically filtering the signal at the output of filter 17 and preferably consisting in a digital filter implemented by the processing unit 10.

The operation starts with the first sweep being carried out. At step 20, the frequency of filter 6 is set at a given frequency $fi_1$ (corresponding e.g. to filter 18); the frequency fol of local oscillator 4 is then set at the lower most value $f_{min}+fi_1$. At step 21, local oscillator 4 is swept and at each frequency step, the processing unit 10 detects and records in buffer 12 the power level of the signal at the output of filter 17. In the simplest embodiment of the invention, buffer 12 simply stores a number of points (corresponding to analysed frequencies) identical to the number of points of the frequency axis in the display memory of screen 14, and processing unit 10 writes in buffer 12 the information to be displayed on screen 14.

At step 22, a test of the validity of the data already in buffer 12 is done. If it is the first sweep done for the current setting, then no computation can be done and the buffer is written on the screen at step 23. We will explain later when the step 30 is chosen.

After step 23, the second sweep is set up at step 40, i.e. the frequency of filter 6 is set at a given frequency $fi_2$ (i.e. $fi_1+\epsilon$ and corresponding e.g. to filter 19) and the frequency fol of local oscillator 4 is set at the lower most value $f_{min}+fi_2$ or $f_{min}-fi_2$ depending of the "side" chosen. At step 41, local oscillator 4 is swept and at each frequency step, the processing unit 10 detects and records in buffer 12 the power level of the signal at the output of filter 17.

At step 42, it is possible to choose to use the simple solution which consists in writing the result on screen 14 and hence the actual rays are stable rays on screen 14 while images rays are flickering on screen 14. Then, the process loops to step 20.

The second choice at step 42 executes the image cancel process (step 50) by selecting the minimum power level for each identical stored frequency point in the display memory for the first sweep and in buffer 12 for the second sweep. This minimum level is stored in the display memory at the same frequency point and thus displayed on screen 14 as mentioned in step 51. The actual rays being the same for each frequency point of buffer 12 and the display memory, they remain displayed on screen 14. In other words, the minimum level is the same in buffer 12 and the display memory at a given frequency for actual rays. In case of image rays not being at the same frequency position in buffer 12 and the display memory, the minimum level for the frequency under computation is, in practice, the noise floor of the instrument. Hence, this noise floor level is stored in the display memory (step 51) and thus displayed at screen 14 instead of this image ray.

At this stage, screen 14 shows the result of a first image-cancel process.

At step 52, most of the image rays were removed. It is then easy to compute the frequency separation of each couple of rays in the display memory and to determine the best choice for the second offset $\epsilon_2$ to set the third intermediate frequency $fi_3$ for the third sweep (i.e. $fi_1+\epsilon_2$) if one or more couples are separated by $2 \cdot |fi_2-fi_1|$.

If no ambiguity exists, i.e. in case no couples are separated by $2 \cdot |\epsilon_2-\epsilon_1|$, then the third sweep is not necessary and the process continues with step 20 else the third sweep is set up at step 61.

At step 61, the frequency of filter 6 is set at the accordingly-selected frequency $fi_3$ and the frequency fol of local oscillator 4 is set at the lower most value $f_{min}+fi_3$ or $f_{min}-fi_3$ depending of the chosen "side". At step 62, local oscillator 4 is swept and at each frequency step, the processing unit 10 detects and records in buffer 12 the power level of the signal at the output of filter 17.

At step 63, once again the image-cancel process is executed by choosing the minimum level for each point between display memory and buffer 12 and writing it in the display memory at the same frequency point. Thus, the result is written on the screen as shown at step 64. At this step, the image rays which could have remained on screen 14 at step 51 are removed.

The process continues at step 20 up to step 22 where the step 30 is chosen because the data on the screen is the valid result of two or more sweeps.

The invention is not limited to the described algorithm which can be changed so as to be more efficient although the underlying principles remain the same.

The invention thus makes it possible to display on the screen only actual rays, and no image rays. Thus, there is no need for the user to discriminate visually between image rays and actual rays; in addition, whatever the actual rays are in the input signals, image rays are eliminated.

Assuming for instance there are rays at $fin_1=10$ GHz and $fin_2=9.92$ GHz in the input signals. Assuming that $fi_1$ is 420

MHz and Fol below fin$_i$, and assuming that the final frequency is at 20 MHz, then second LO 15 will be at 400 MHz. As discussed above, the first sweep will generate actual rays at 10 and 9.92 GHz, and image rays at 9.16 and 9.08 GHz.

Assuming that fi2 is 380 MHz (i.e. ϵ=–40 MHz) and Fol below fin$_i$, the final frequency and the second LO frequency do not change. As discussed above, the second sweep will generate:

actual rays at 10 and 9.92 GHz and image rays at 9.24 and 9.16 GHz.

After the first two sweeps and after applying a first cancellation process, there remains in the display memory three rays, at 9.16, 9.92 and 10 GHz. The image ray at 9.16 GHz is not removed. The absolute value of the second offset ϵ$_2$ should be different from (10–9.16)/2=420 MHz, from (10–9.92)/2=40 MHz and from (9.92–9.16)/2=380 MHz. As a result, the following intermediate frequencies for the third sweep should be different from fi$_1$+ϵ$_2$, i.e. 0, 40, 380, 460, 800 and 840 MHz. Thus, selecting e.g. Fi$_3$=425 MHz, and Fol below fin$_i$, then the second LO frequency is set to 405 MHz so that the final frequency remains at 20 MHz. As discussed above, the third sweep will generate actual rays at 10 and 9.92 GHz, and image rays at 9.15 and 9.07 GHz.

After applying the cancellation process, the only rays remaining at the end of the third sweep are the actual rays at 10.0 and 9.92 GHz.

In another embodiment, the image-ray distinction process carried out in the third sweep is already carried out in the second sweep. In this case, the third sweep is omitted. The first sweep is carried out in the same way than previously described. In other words, a first intermediate frequency fit (corresponding to a filtering frequency of filter 6) is selected for the first sweep and the first sweep produces expected rays as well as image rays in the same way than already explained for the previous embodiment.

After the first sweep, a second sweep is carried out similarly as in the previous embodiment. So, the second sweep is carried out so that the actual rays of the second sweep are identical to the actual rays of the first sweep. But while image rays of the second sweep were offset with respect to image rays of the first sweep under most circumstances in the previous embodiment, here the second sweep is carried out so as to ensure that all of the image rays of the second sweep are offset with respect to the image rays of the first sweep. This may also be done by shifting the frequencies of the local oscillator and of the filter by a same offset ϵ (ϵ being of course not equal to zero) as in the previous embodiment; see explanations about relation (9). The intermediate frequency during the second sweep is fi$_2$=fi$_1$+ϵ (ϵ here again, ϵ may be either positive or negative) and corresponds to a filtering frequency of filter 6. However, in the present case, offset ϵ is chosen so that all of the image rays of the second sweep are offset with respect to the image rays of the first sweep. Similarly as indicated in the previous embodiment, an image ray of the first sweep and an image ray of the second sweep are superimposed when two actual rays are separated by 2·ϵ. To ensure that all of the image rays of the second sweep are offset with respect to the image rays of the first sweep, one can assume that all rays generated during the first sweep are actual rays. Then, offset ϵ is selected so as to be different of half of the difference of the frequencies of any couple of rays generated during the first sweep.

In other words, if a number n of rays (actual rays and image rays) are generated during the first sweep and by designating each ray by F$_i$, i being an integer ranging from 1 to n, then offset ϵ is chosen so that:

$$\varepsilon \ne \frac{F_t - F_u}{2}$$

for all possible values of integers t and u, with 1≦t≦n and 1≦u≦n.

Of course, in case a second mixer 16 and a second LO 15 are used, the frequency of the second LO 15 is also changed for the second sweep with respect of the first sweep so as to keep the same final frequency at the output of mixer 16.

As a result, only actual rays are superimposed in the first and second sweeps while image rays are not superimposed, thus allowing to distinguish image rays and actual rays.

The implementation of this embodiment may be carried out similarly to the previous embodiment by recording the power level at the output of filter 17 in the display memory during the first sweep (which is displayed on screen 14) and by recording the power level at the output of filter 17 in buffer 12 during the second sweep. Then, processing unit 10 selects the minimum power level for each identical frequency point in the display memory for the first sweep and in buffer 12 for the second sweep and stores this minimum level in the display memory at the same frequency point which is thus displayed on screen 14. As a result, all the actual rays will be displayed on screen 14 while all the image rays were removed and replaced by noise floor levels of the instrument. As mentioned, filter 6 is chosen so as to be able to filter around fi$_1$ for the first sweep and around fi$_2$ for the second sweep, but it does not necessarily comprise two filters 18 and 19 as a single filter with an adequate bandwidth can be sufficient.

The three-sweep embodiment is more advantageous because it involves less computations for determining offset ϵ$_2$ for the third sweep than for determining offset ϵ for the two-sweep embodiment in view of the fact that most of the image rays are already distinguished in the second sweep when using the three-sweep embodiment and thus computations have only to be done for the rays superimposed in the first and second sweeps.

The invention applies notably to spectrum analysers. But the invention is not limited to the embodiments exemplified above. Notably, the circuit for displaying image rays and actual rays and the cancellation process may be used for purposes other than the carrying out of the invention; one could use this circuit and cancellation process in a prior-art analyser, for displaying the result of two sweeps. The circuit of FIG. 2 is only exemplary; the processing and comparison between the rays could be carried out in the buffer, provided an appropriate addressing and writing logic is provided.

In addition, one could use another circuit than the one of FIG. 2. For instance, one could store separately the results of the first and second sweeps, and then compute the resulting spectrum. One could take into consideration for computing the second offset not only stable rays—superimposed in the first and second sweeps—but all rays obtained in the first and second sweeps. This would make computation more difficult, but would still operate. The rays obtained at the end of the third sweep need not be displayed on a screen if another displaying or recording method is used.

The described embodiments of the invention makes use of the display memory for implementing the image-ray cancellation process and can apply to any frequency scanning step of the first LO. As usually the number of analysed frequency points is greater than the number of points in the display memory, the internal process of the spectrum analyser is preferably designed to adapt the number of analysed frequency points to the number of points of the display memory. If rays are very close from each others, then the spectrum analyser cannot separate them on the screen except by doing a zoom around the rays. The image ray cancel process follows the same constraints.

The invention was described with reference to preferred embodiments. However, many variations are possible within the scope of the invention. For example, it would be possible to carry out the invention with more than three sweeps. In particular, it would be possible to do more than two sweeps during each of which another offset for the intermediate frequency is used and to do a final sweep with a determination of a further offset so as to distinguish image rays superimposed in all the previous sweeps from superimposed actual rays. Further, the determination of superimposed rays and in particular the determination of minimum levels as described can de done by successive iteration on two sweeps at each iteration as described or alternatively on all sweeps in one time.

The invention claimed is:

1. A process for eliminating image rays generated in a frequency converter that generates actual rays and image rays from frequency rays of an input signal, the frequency converter comprising:
   a first mixer that mixes the input signal and a signal provided by a first local frequency source, and
   a filter assembly that filters the mixed signals output by the mixer, the process comprising:
   a first sweep, wherein a frequency of the signal provided by the first local frequency source is varied and wherein a signal level including actual and image rays at an output of the frequency converter is recorded for a set of converted frequencies;
   a second sweep, wherein the frequency of the signal provided by the first local frequency source is varied and wherein the signal level including actual and image rays at the output of the frequency converter is recorded for said set of converted frequencies, said second sweep being carried out so that a frequency of the actual ray generated in the second sweep by an input ray is the same as a frequency of the actual ray generated in said first sweep by said input ray, and the frequency of the image ray generated in the second sweep by an input ray is not the same as the frequency of the image ray generated in said first sweep by said input ray;
   determining if a ray-including signal level was recorded both during the first sweep and the second sweep for at least one converted frequency; and
   displaying an indication of a presence of a ray for said at least one converted frequency on a screen only if said determination is positive,
   wherein the first sweep and the second sweep are performed with respect to a common input signal,
   wherein the filter assembly comprises a first bandpass filter and a second bandpass filter that filter each a respective band of frequencies,
   wherein said first bandpass filter filters the mixed signals, which are outputted by the first mixer during the first sweep and which do not pass though the second bandpass filter,
   and wherein said second bandpass filter filters the mixed signals, which are outputted by the first mixer during the second sweep and which do not pass through the first bandpass filter.

2. The process according to claim 1, wherein said determining and displaying are carried out for the whole set of converted frequencies.

3. The process according to claim 1, comprising:
   displaying an indication of the presence of a ray on the screen for each converted frequency for which a ray-including signal level is recorded during the first sweep; and
   if displaying an indication of the presence of a ray on the screen for each converted frequency, an indication of the presence of a ray is displayed on the screen for said at least one converted frequency and if said determination is negative for said at least one converted frequency, then canceling the display of said indication of the presence of a ray on the screen for said at least one converted frequency.

4. The process according to claim 1, wherein:
   the signal levels recorded during the first sweep are recorded in a display memory of the screen;
   the signal levels recorded during the second sweep are recorded in a buffer;
   determining a minimum signal level recorded during the first sweep and during the second sweep for said at least one converted frequency; and
   storing the determined minimum signal level for said converted frequency in the display memory.

5. The process according to claim 1, wherein for both of said sweeps, each recorded signal level is assigned to a converted frequency which is determined by adding or subtracting a fixed intermediate frequency within a bandwidth of the filter assembly to or from the frequency of the first local frequency source at the time said recorded signal level was recorded.

6. The process according to claim 1, wherein for both of said sweeps, each recorded signal level is assigned to a converted frequency which is determined by a sum of the frequency of the first local frequency source at the time said recorded signal level was recorded and a fixed intermediate frequency within a bandwidth of the filter assembly and wherein said intermediate frequency is different for each of both sweeps.

7. The process according to claim 1, wherein for both of said sweeps, each recorded signal level is assigned to a converted frequency which is determined by subtracting a fixed intermediate frequency within a bandwidth of the filter assembly from a frequency of a first local frequency source at a time said recorded signal level was recorded and wherein said intermediate frequency is different for both of said sweeps.

8. The process according to claim 1, wherein:
   for one of said first and second sweeps, each recorded signal level is affected to a converted frequency which is determined by a sum of a frequency of the first local frequency source at the time said recorded signal level was recorded and a fixed intermediate frequency within a bandwidth of the bandpass filter; and
   for the other of said first and second sweeps, each recorded signal level is affected to a converted frequency which is determined by subtracting a fixed intermediate frequency within the bandwidth of the bandpass filter from the frequency of the first local frequency source at the time said recorded signal level was recorded.

9. The process according to claim 1, wherein the frequency converter further comprises:

a second mixer that mixes the filtered mixed signals output by the filter assembly and a signal provided by a second local frequency source, the frequency of the second local frequency source being adjusted so that the second mixer outputs a signal at a same fixed predetermined frequency for each sweep; and a final filter that filters the mixed signals output by the second mixer to only provide signals at said fixed predetermined frequency.

10. The process according to claim 9, wherein the frequency of the second local frequency source is the same for both of said sweeps.

* * * * *